(12) United States Patent
Xie et al.

(10) Patent No.: US 9,362,279 B1
(45) Date of Patent: Jun. 7, 2016

(54) CONTACT FORMATION FOR SEMICONDUCTOR DEVICE

(71) Applicant: GLOBALFOUNDRIES Inc., Grand Cayman (KY)

(72) Inventors: Ruilong Xie, Schenectady, NY (US); Andy Wei, Queensbury, NY (US); William James Taylor, Clifton Park, NY (US); Ryan Ryoung-han Kim, Albany, NY (US); Kwan-Yong Lim, Niskayuna, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,171

(22) Filed: Jan. 29, 2015

(51) Int. Cl.
*H01L 27/088* (2006.01)
*H01L 29/66* (2006.01)
*H01L 21/762* (2006.01)
*H01L 21/02* (2006.01)
*H01L 21/8234* (2006.01)
*H01L 29/417* (2006.01)

(52) U.S. Cl.
CPC ........ *H01L 27/0886* (2013.01); *H01L 21/0217* (2013.01); *H01L 21/02167* (2013.01); *H01L 21/02529* (2013.01); *H01L 21/02532* (2013.01); *H01L 21/76224* (2013.01); *H01L 21/823431* (2013.01); *H01L 21/823437* (2013.01); *H01L 21/823475* (2013.01); *H01L 21/823481* (2013.01); *H01L 29/41775* (2013.01); *H01L 29/41791* (2013.01); *H01L 29/66545* (2013.01)

(58) Field of Classification Search
CPC ................... H01L 27/0886; H01L 21/845
USPC .................................................. 257/401
See application file for complete search history.

(56) References Cited

U.S. PATENT DOCUMENTS 9,171,752 B1 * 10/2015 Wu .................. H01L 21/76224
2015/0091100 A1 * 4/2015 Xie .................. H01L 21/76224
257/401

* cited by examiner

*Primary Examiner* — David Vu
*Assistant Examiner* — Brandon Fox
(74) *Attorney, Agent, or Firm* — Wayne F. Reinke, Esq.; Heslin Rothenberg Farley & Mesiti, P.C.

(57) ABSTRACT

A method of contact formation and resulting structure is disclosed. The method includes providing a starting semiconductor structure, the structure including a semiconductor substrate with fins coupled to the substrate, a bottom portion of the fins being surrounded by a first dielectric layer, dummy gates covering a portion of each of the fins, spacers and a cap for each dummy gate, and a lined trench between the gates extending to and exposing the first dielectric layer. The method further includes creating an epitaxy barrier of hard mask material between adjacent fins in the trench, creating N and P type epitaxial material on the fins adjacent opposite sides of the barrier, and creating sacrificial semiconductor epitaxy over the N and P type epitaxial material, such that subsequent removal thereof can be done selective to the N and P type of epitaxial material. The resulting structure has replacement (conductive) gates, conductive material above the N and P type epitaxy, and a contact to the conductive material for each of N and P type epitaxy.

16 Claims, 14 Drawing Sheets

US 9,362,279 B1

CONTACT FORMATION FOR SEMICONDUCTOR DEVICE

BACKGROUND OF THE INVENTION

1. Technical Field

The present invention generally relates to contact formation for semiconductor devices. More particularly, the present invention relates to the inclusion of a barrier between different types of epitaxy to prevent merger thereof.

2. Background Information

The continued size reduction of semiconductor devices has consequences not only for the devices themselves (developing new fabrication techniques), but also for the metallization providing electrical connections to the devices. For example, with respect to three-dimensional transistors (e.g., FinFETs), conventional contact formation can easily result in a short between the gate contact and the source or drain contact unless the source/drain contact fully encompasses or "straps" all the fins. To avoid this prospect, conventional fabrication moves the gate contact farther away from its ideal location. In addition, as the space between different devices becomes smaller and smaller, a source/drain epi-to-epi short among different devices easily results.

Thus, a need exists for a way to prevent the source/drain epitaxy on different devices from shorting each other, and to keep the gate contact closer to the gate, while still avoiding a short between the gate contact and source/drain contact.

SUMMARY OF THE INVENTION

The shortcomings of the prior art are overcome and additional advantages are provided through the provision, in one aspect, of a method of contact formation. The method includes providing a starting semiconductor structure, the structure including a semiconductor substrate, a plurality of raised semiconductor structures coupled to the substrate, a bottom portion of the plurality of raised structures being surrounded by a first dielectric layer, at least one dummy gate covering a portion of each of the plurality of raised structures, and spacers and a cap for each dummy gate. The method further includes creating at least one epitaxy barrier of hard mask material between adjacent raised structures, creating the different types of epitaxial material on the plurality of raised structures adjacent opposite sides of the at least one epitaxy barrier, and creating sacrificial semiconductor epitaxy over the different types of epitaxial material, such that subsequent removal thereof can be done selective to the different types of epitaxial material.

In accordance with another aspect, a semiconductor structure is provided. The structure includes a semiconductor substrate, and a plurality of raised semiconductor structures coupled to the substrate, a bottom portion of the plurality of raised structures being surrounded by a first dielectric layer. The structure further includes at least one conductive gate covering a portion of each of the plurality of raised structures, spacers and a cap for each conductive gate, at least one epitaxy barrier situated between adjacent raised structures extending into the first dielectric layer, and different types of epitaxial material adjacent opposite sides of each epitaxy barrier.

In accordance with yet another aspect, an intermediate semiconductor structure is provided. The structure includes a semiconductor substrate, and a plurality of raised semiconductor structures coupled to the substrate, a bottom portion of the plurality of raised structures being surrounded by a first dielectric layer. The structure further includes at least one dummy gate covering a portion of each of the plurality of raised structures, spacers and a cap for each dummy gate, and at least one epitaxy barrier of hard mask material situated between adjacent raised structures extending into the first dielectric layer.

These, and other objects, features and advantages of this invention will become apparent from the following detailed description of the various aspects of the invention taken in conjunction with the accompanying drawings.

DETAILED DESCRIPTION OF THE INVENTION

Figure 1:
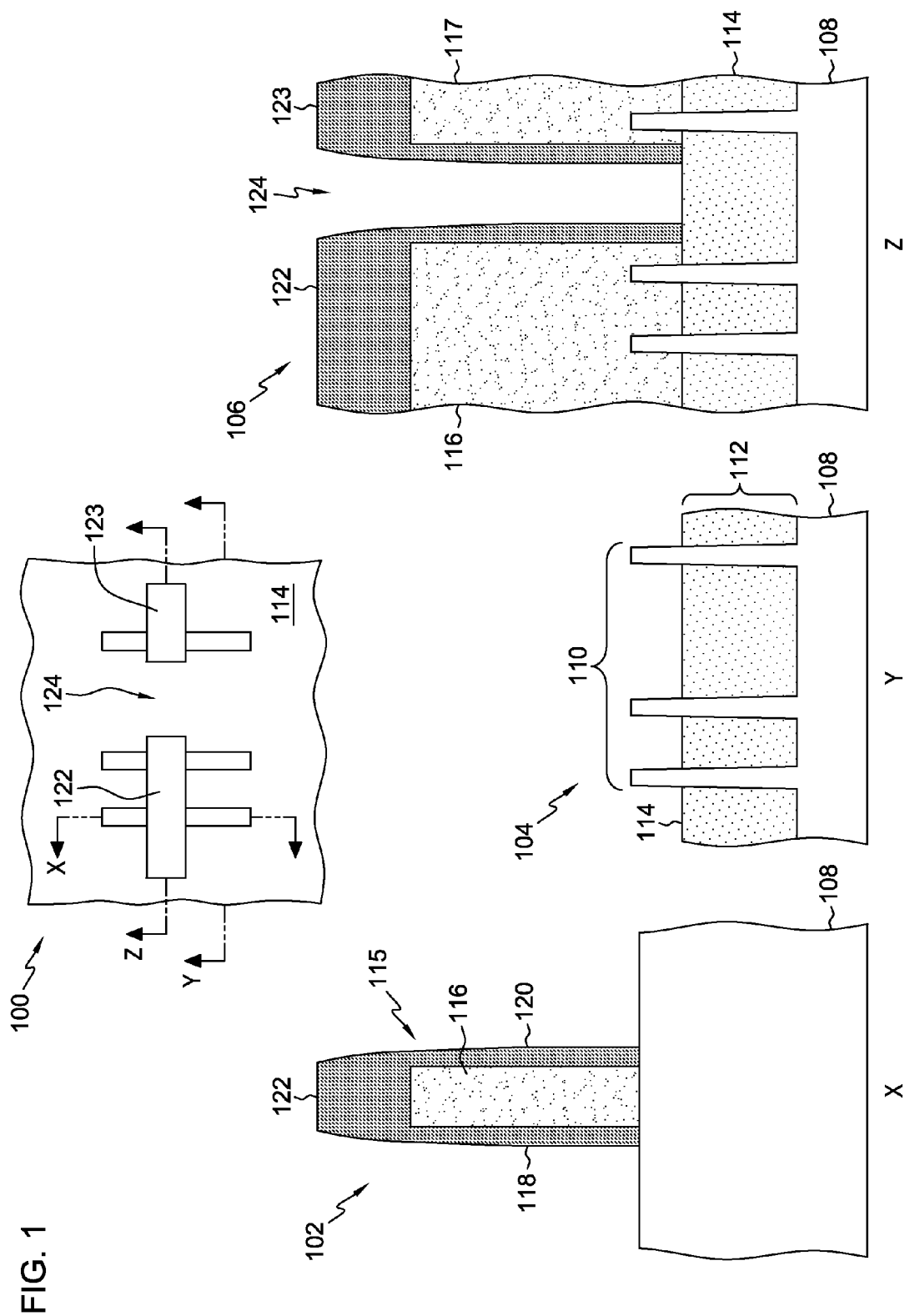
FIG. 1 is a top view with corresponding select cross-sectional views of one example of a starting non-planar semiconductor structure, the structure including a semiconductor substrate, multiple raised semiconductor structures coupled to the substrate, a bottom portion of the raised structures being surrounded by a first dielectric layer, two dummy gates covering a portion of the raised structures, spacers and a gate cap for each dummy gate, and a lined trench between the dummy gates exposing the first dielectric layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a top view 100 with corresponding select cross-sectional views (102, 104 and 106) of one example of a starting semiconductor structure, the structure including a semiconductor substrate 108, multiple raised semiconductor structures 110 coupled to the substrate, a bottom portion 112 of the raised structures being surrounded by a first dielectric layer 114, one or more dummy gates (116 and 117, in this example) covering a portion of the relevant raised structures (see top view 100), spacers (e.g., 118 and 120) and a gate cap (122, 123) for each dummy gate. The gate structures in this example are separated by a space 124 or trench, which may be lined. However, it will be understood that the gate structure could be continuous, such as in the case of a shared gate between adjacent devices.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 108 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 108 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structures 110 may each take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type. The structure further includes at least one dummy gate structure 115 surrounding a portion of one or more of the raised structures, each dummy gate structure including a dummy gate 116 and spacers 118 and 120, as well as a gate cap 122.

In one example, the material of the dummy gate may include, for example, polysilicon, and the gate cap and spacers may include a hard mask material, for example, silicon nitride.

Figure 2:
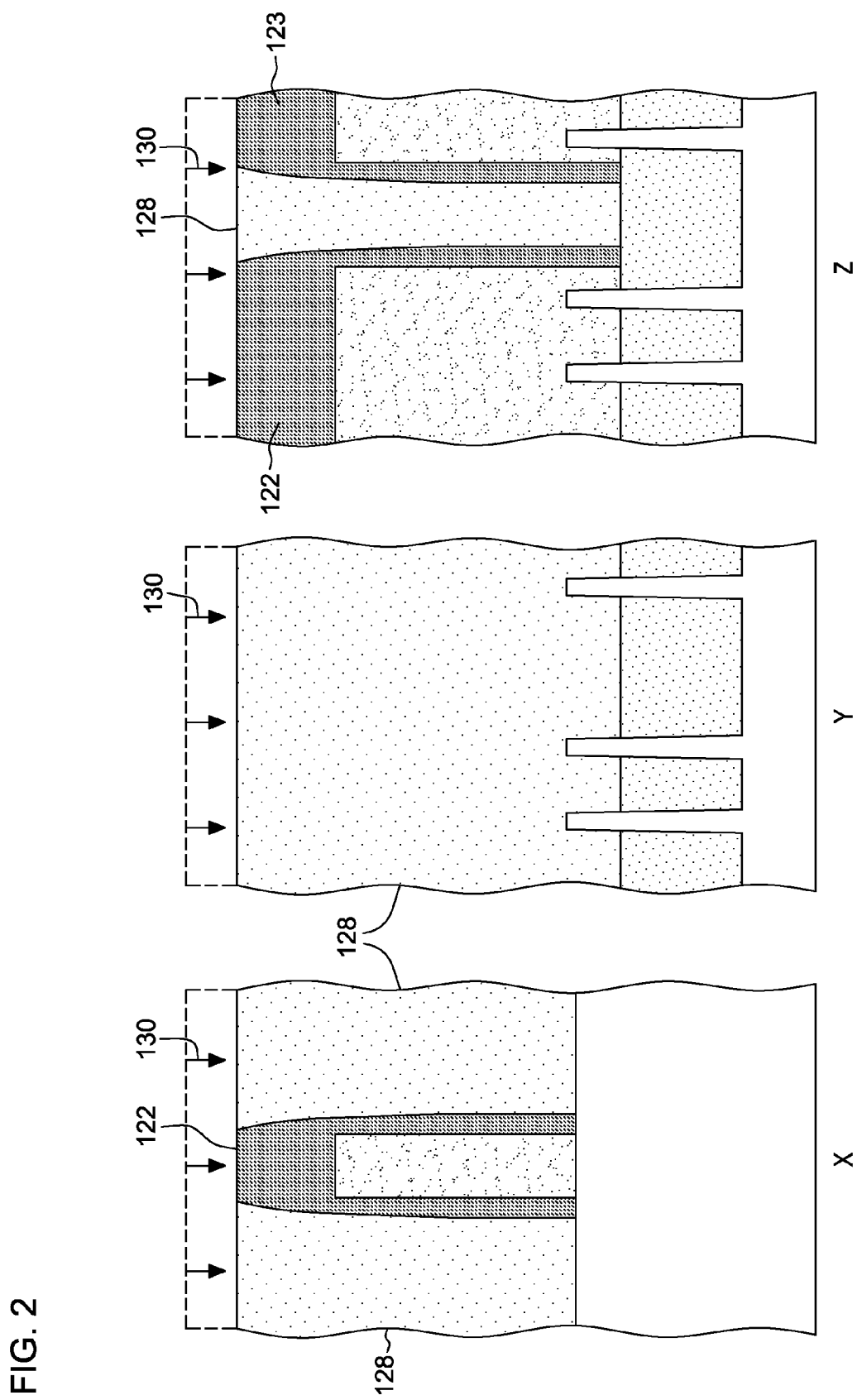
FIG. 2 depicts one example of the structure of FIG. 1 after creation of a conformal blanket dielectric layer, the conformed blanket dielectric layer also filling the trench, and planarization of the blanket layer, stopping on the gate cap, in accordance with one or more aspects of the present invention.

FIG. 2 depicts one example of the structure of FIG. 1 after deposition of a blanket dielectric layer 128, which also fills the space 124 between the gate structures, and planarization 130 of the blanket layer, stopping on the gate cap(s) 122 and 123, in accordance with one or more aspects of the present invention. In one example, the deposition may be accomplished using, for example, conventional processes and techniques, and the planarization may be accomplished using, for example, a chemical-mechanical polishing process.

Figure 3:
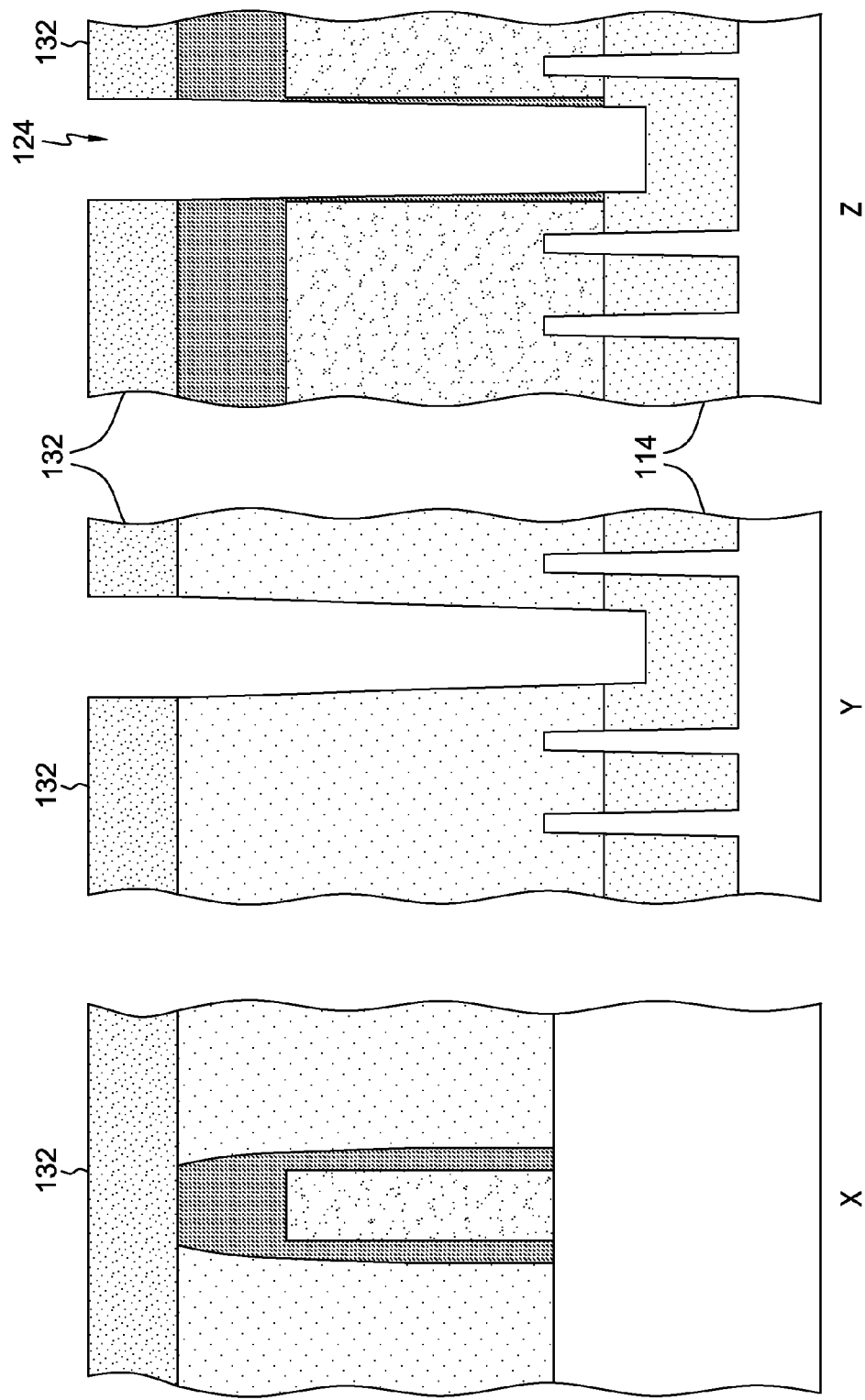
FIG. 3 depicts one example of the structure of FIG. 2 after creating a soft mask (e.g., a layer of lithographic blocking material) and patterning to remove the blanket dielectric from the trenches, effectively extending the trenches into the first dielectric layer, in accordance with one or more aspects of the present invention.

FIG. 3 depicts one example of the structure of FIG. 2 after creating a soft mask 132 (e.g., a layer of lithographic blocking material) and patterning (e.g., using lithography) to remove (e.g., by etching) the blanket dielectric 128 from the filled space 124 between gate structures, the removing effectively extending the space into the first dielectric layer 114, in accordance with one or more aspects of the present invention. Note that removal of the blanket dielectric from the space may also remove some of the liner 126. Note also that, for shared gates, the etch process should be selective to the gate cap and spacer material (e.g., SiN) to avoid damage to the gate.

Figure 4:
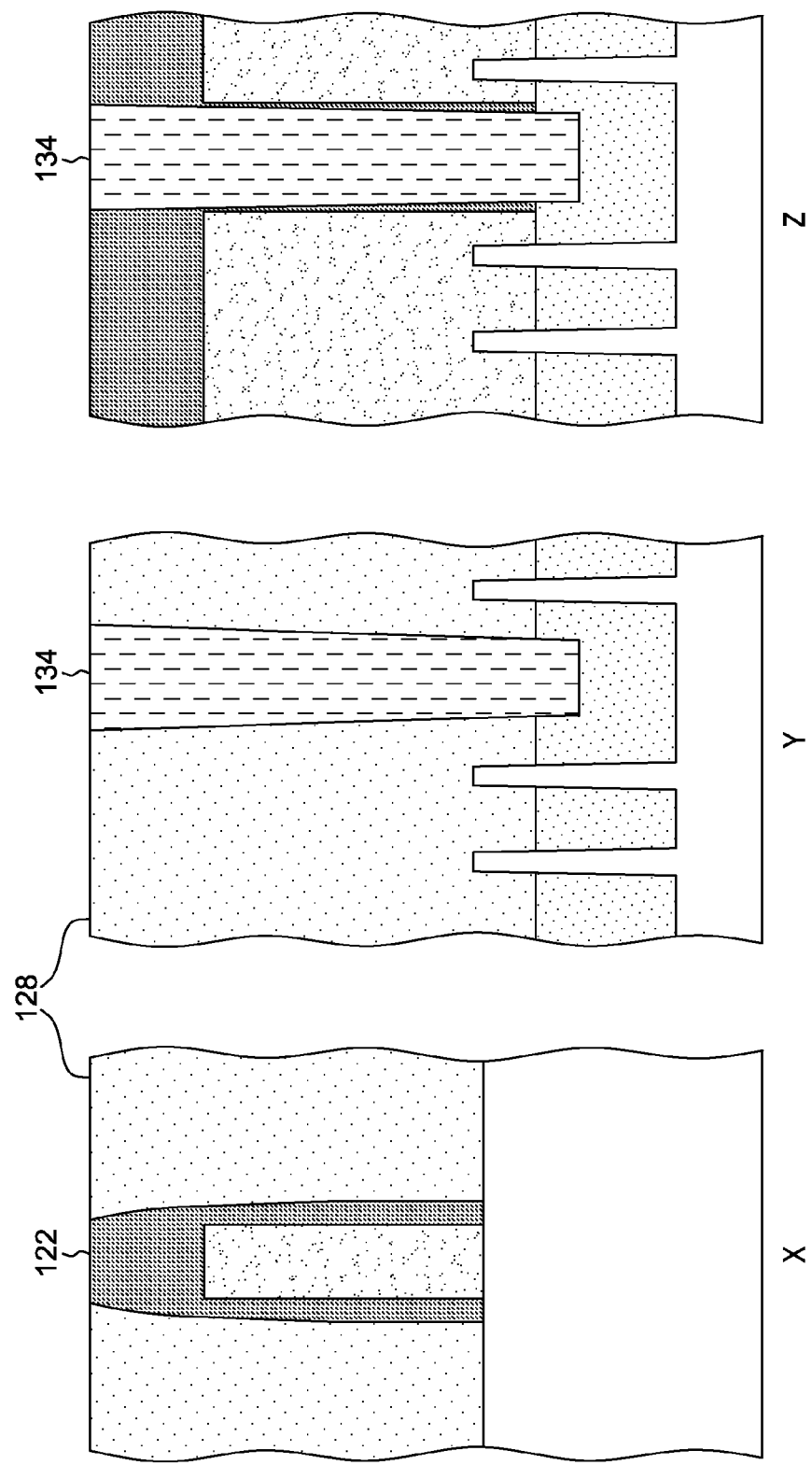
FIG. 4 depicts one example of the structure of FIG. 3 after removing the layer of lithographic blocking material, filling the extended trenches with a hard mask material that is different from that of the spacers and gate caps, and which creates an epitaxy barrier to prevent merger of the different types of adjacent epitaxy, and planarizing down to the gate caps, in accordance with one or more aspects of the present invention.

FIG. 4 depicts one example of the structure of FIG. 3 after removing the layer (132, FIG. 3) of lithographic blocking material, filling the extended space between gates (124, FIG. 3) with a hard mask material, different from that of the spacers and cap, which creates an epitaxy barrier 134 to prevent merger of subsequent n-type and p-type epitaxial semiconductor material, and planarizing down to the gate caps 122 and 123, in accordance with one or more aspects of the present invention.

Removal of the layer of lithographic blocking material and filling the space between the gates may be accomplished using, for example, known processes and techniques. The planarizing may be accomplished using, for example, a chemical-mechanical polishing process. The hard mask material of epitaxy barrier 134 may include, for example, a low-k nitride (e.g., SiBCN).

Figure 5:
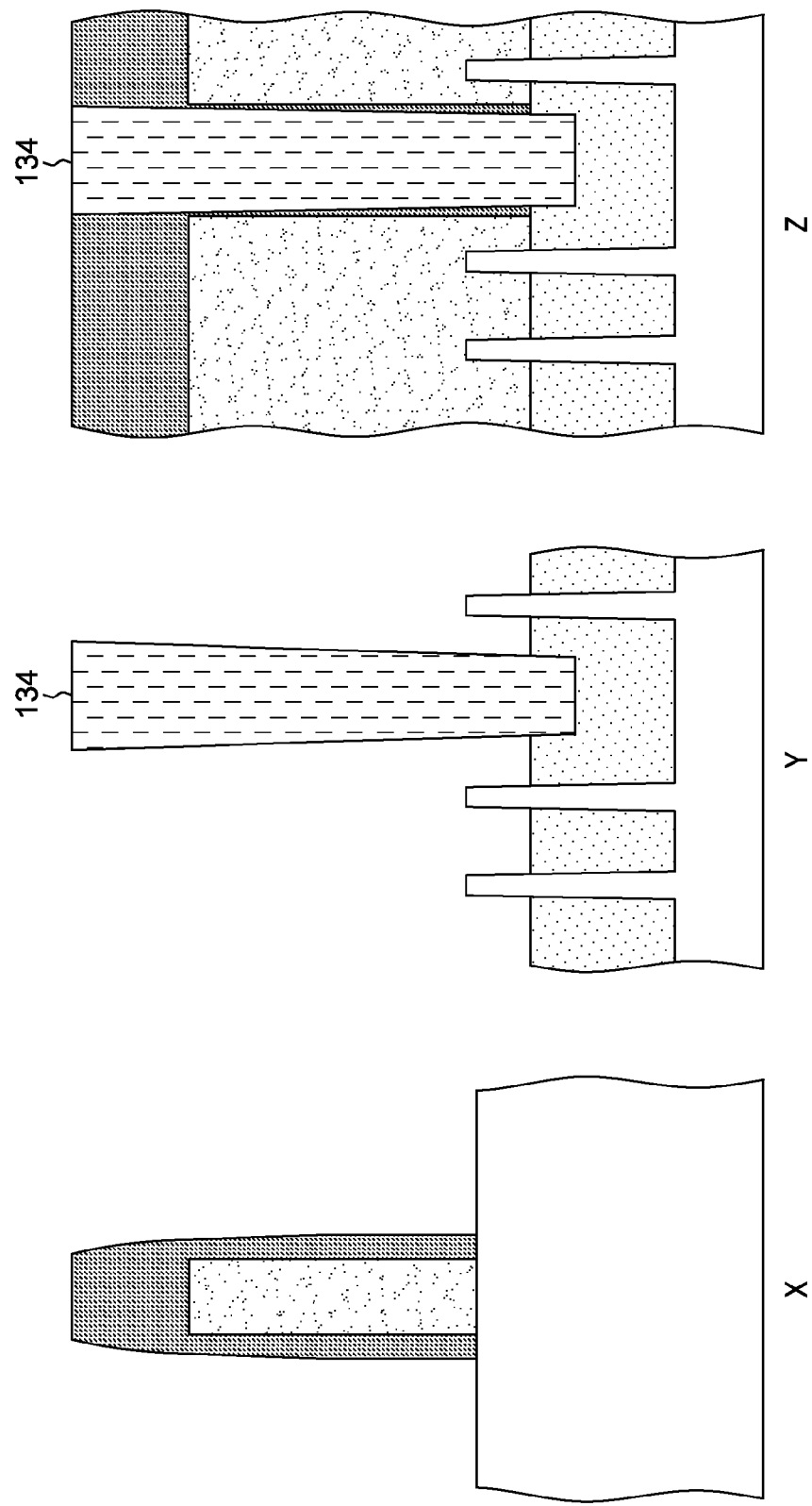
FIG. 5 depicts one example of the structure of FIG. 4 after selective removal of the blanket dielectric layer, exposing the epitaxy barrier, in accordance with one or more aspects of the present invention.

FIG. 5 depicts one example of the structure of FIG. 4 after selective removal of the blanket dielectric layer (128, FIG. 4), exposing the epitaxy barrier 134 along the y-direction, in accordance with one or more aspects of the present invention. Selective removal of the blanket dielectric layer may be accomplished using, for example, a wet etch process with BHF (buffered hydrofluoric acid) cleaning process.

Figure 6:
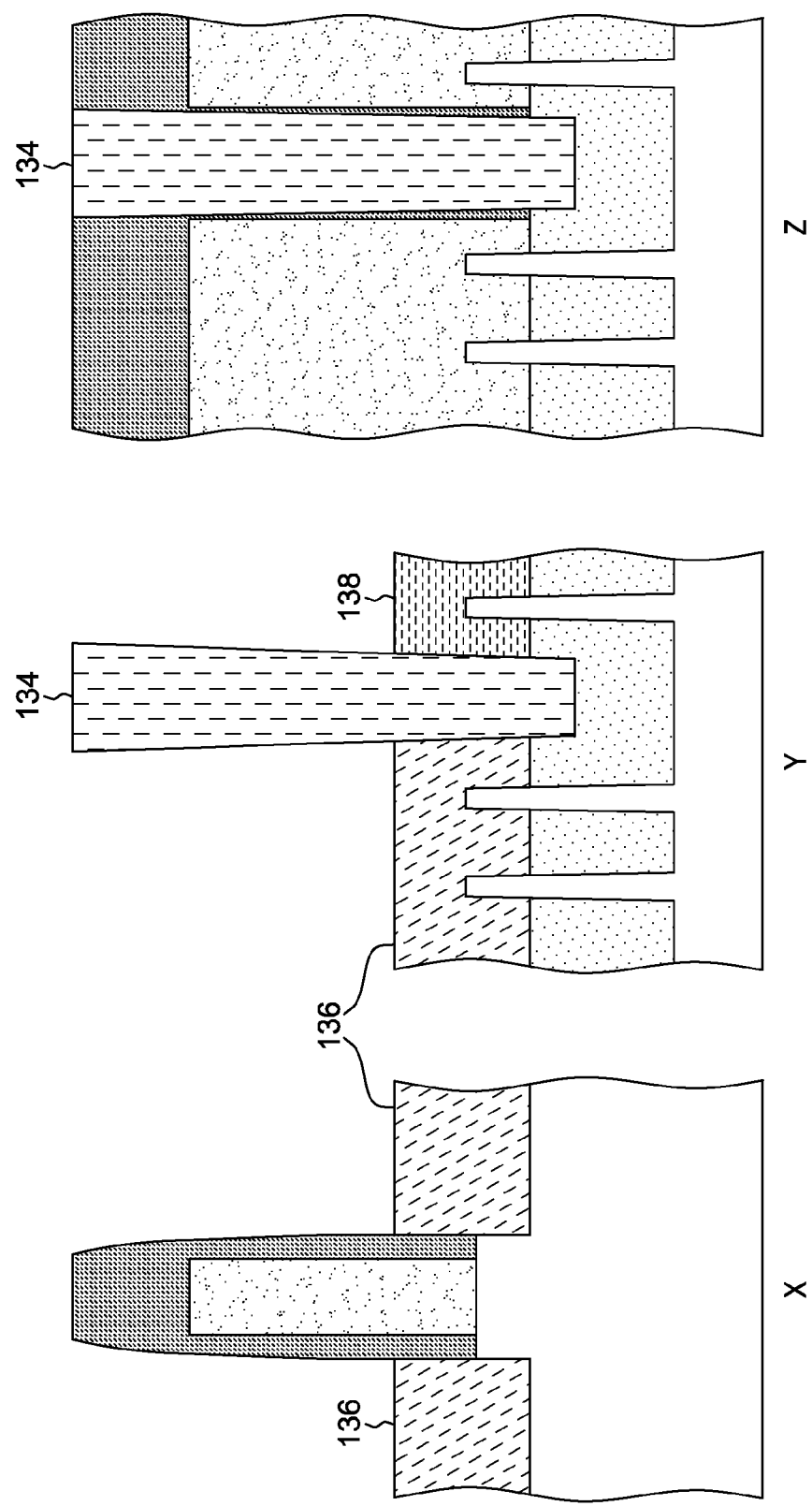
FIG. 6 depicts one example of the structure of FIG. 5 after creation of the different types of epitaxial semiconductor material (i.e., n-type and p-type) adjacent the barrier, in accordance with one or more aspects of the present invention.

FIG. 6 depicts one example of the structure of FIG. 5 after creation of the different types (136 and 138) of epitaxial semiconductor material (i.e., n-type and p-type, respectively) adjacent the barrier 134 on raised structures 110, in accordance with one or more aspects of the present invention.

Creation of the different types of epitaxy may be accomplished using, for example, known processes and techniques. The p-type epitaxy may include, for example, epitaxial silicon germanium (SiGe), and the n-type epitaxy may include, for example, epitaxial silicon, epitaxial silicon carbide (SiC) or phosphorus-doped epitaxial silicon (SiP).

Figure 7:
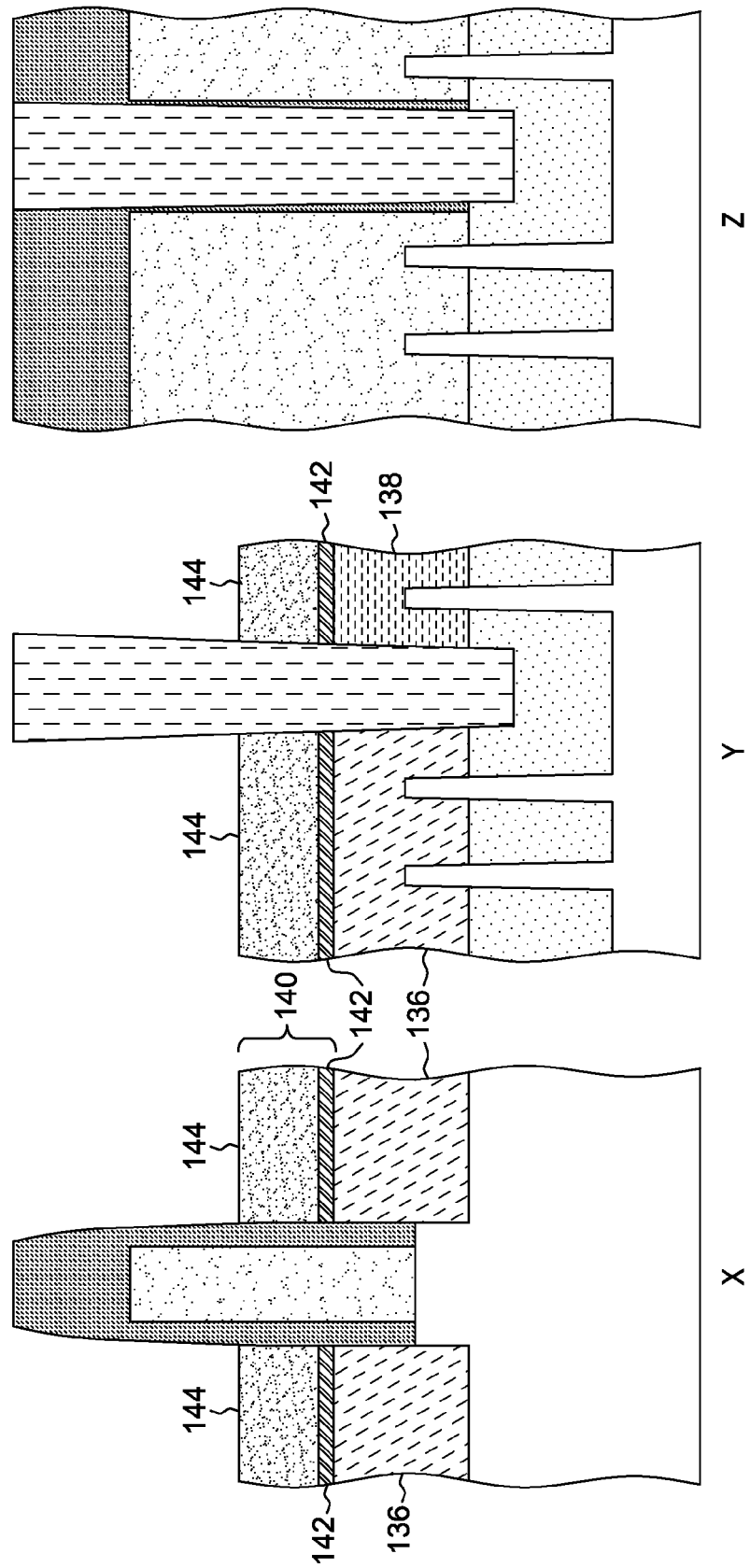
FIG. 7 depicts one example of the structure of FIG. 6 after creation of sacrificial epitaxial semiconductor material over the different types of epitaxial semiconductor material, in this example, two different layers of sacrificial epitaxy, in accordance with one or more aspects of the present invention.

FIG. 7 depicts one example of the structure of FIG. 6 after creation of sacrificial epitaxial semiconductor material 140 over the different types of epitaxial semiconductor material (136 and 138), in this example, two different layers of sacrificial epitaxy are used, in accordance with one or more aspects of the present invention.

In one example, the sacrificial epitaxy 140 may include, for example, two different materials to ensure that removal of the sacrificial epitaxy is selective to the different types of epitaxy 136 and 138. The two different epitaxial materials may include, for example, a bottom layer 142 of epitaxial silicon carbide and a top layer 144 of epitaxial silicon. In the present example, the bottom layer is thin, compared to the top layer. In addition, the sacrificial epitaxy may or may not have added impurities (e.g., by doping).

Figure 8:
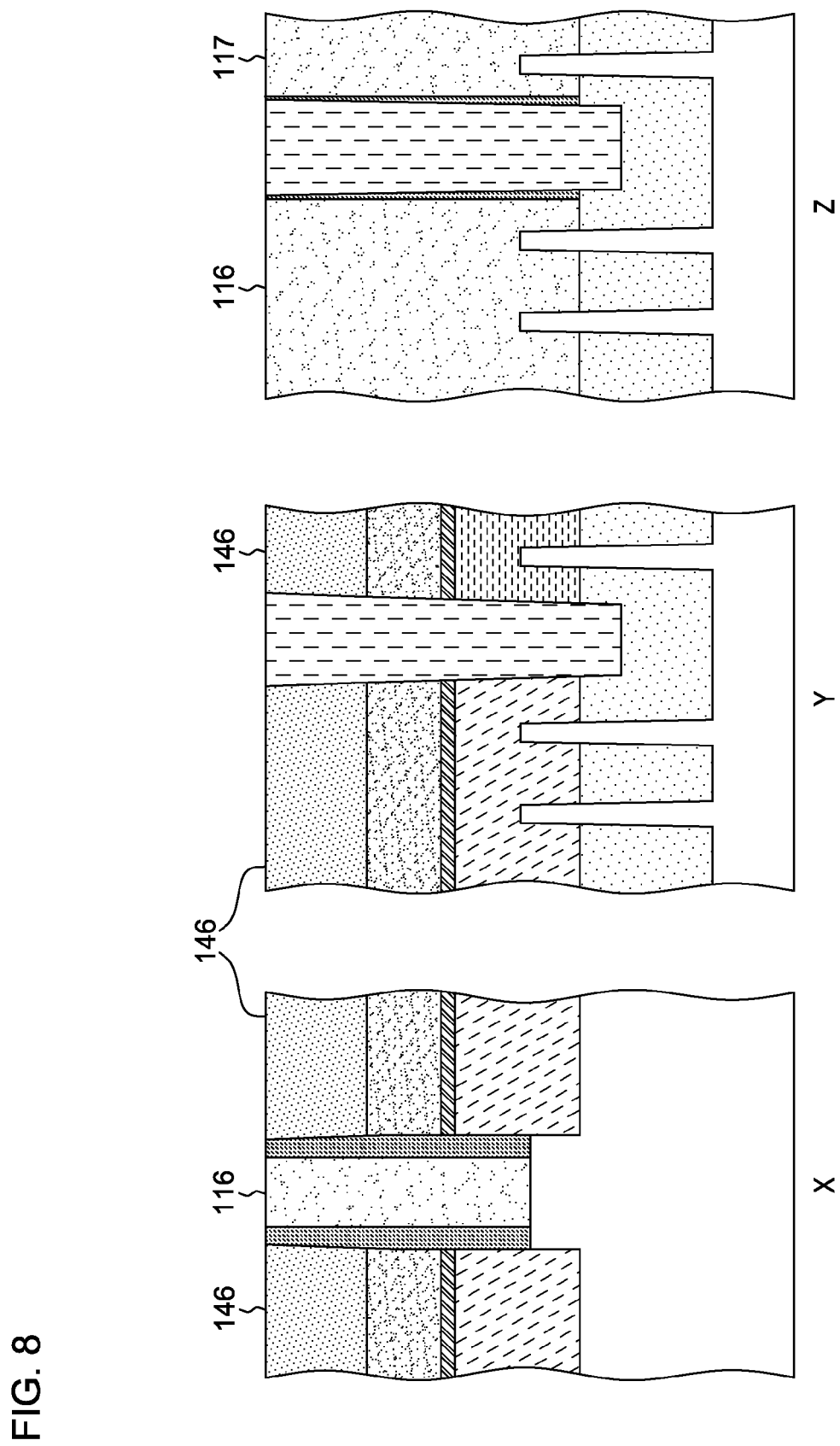
FIG. 8 depicts one example of the structure of FIG. 7 after creation of a second dielectric layer over the sacrificial epitaxial semiconductor material and planarizing to expose the dummy gate, in accordance with one or more aspects of the present invention.

FIG. 8 depicts one example of the structure of FIG. 7 after creation of a second dielectric layer 146 over the sacrificial epitaxial semiconductor material and planarizing to expose dummy gates 116 and 117, in accordance with one or more aspects of the present invention.

Creation of the second dielectric layer may be accomplished using, for example, conventional processes and techniques (e.g., deposition), while the planarizing may be accomplished using, for example, a chemical-mechanical polishing process.

Figure 9:
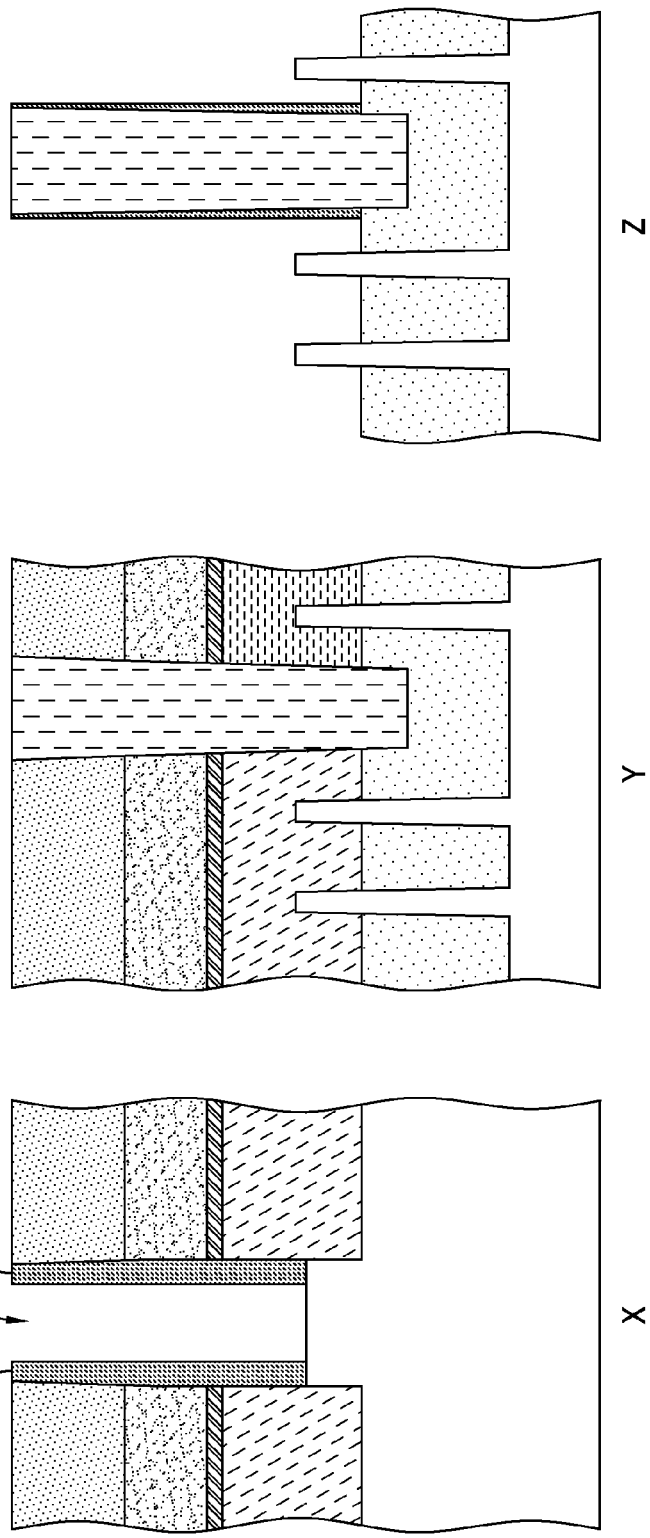
FIG. 9 depicts one example of the structure of FIG. 8 after removal of the dummy gate material, resulting in gate trenches, in accordance with one or more aspects of the present invention.

FIG. 9 depicts one example of the structure of FIG. 8 after removal of the material of the dummy gates (116 and 117, FIG. 8), leaving spacers (e.g., spacers 118 and 120) defining gate trenches (e.g., gate trench 148), in accordance with one or more aspects of the present invention. Removal of the dummy gate material may be accomplished using, for example, conventional processes and techniques.

Figure 10:
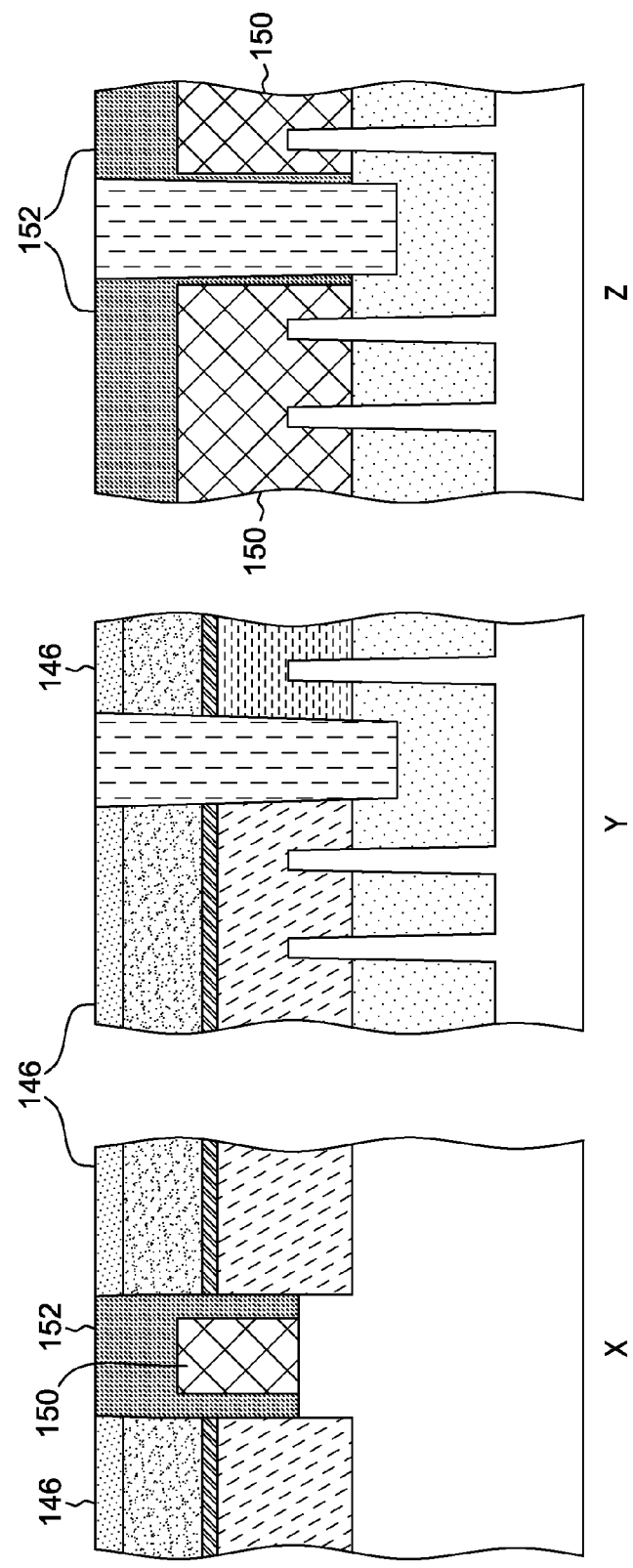
FIG. 10 depicts one example of the structure of FIG. 9 after filling the gate trenches with conductive material and creating another gate cap, in accordance with one or more aspects of the present invention.

FIG. 10 depicts one example of the structure of FIG. 9 after filling the gate trenches with gate dielectric material (e.g., hafnium oxide ($HfO_2$)) and conductive material 150, removing excess gate dielectric and conductive material and leaving space for creating another gate cap 152, followed by planarizing the structure, in accordance with one or more aspects of the present invention.

Filling the gate trenches with gate dielectric and conductive material 150 (e.g., tungsten with or without one or more work function materials), removing excess material and creating gate cap 152 may each be accomplished using, for example, conventional processes and techniques. Planarizing the structure may be accomplished using, for example, a chemical-mechanical polishing process.

Figure 11:
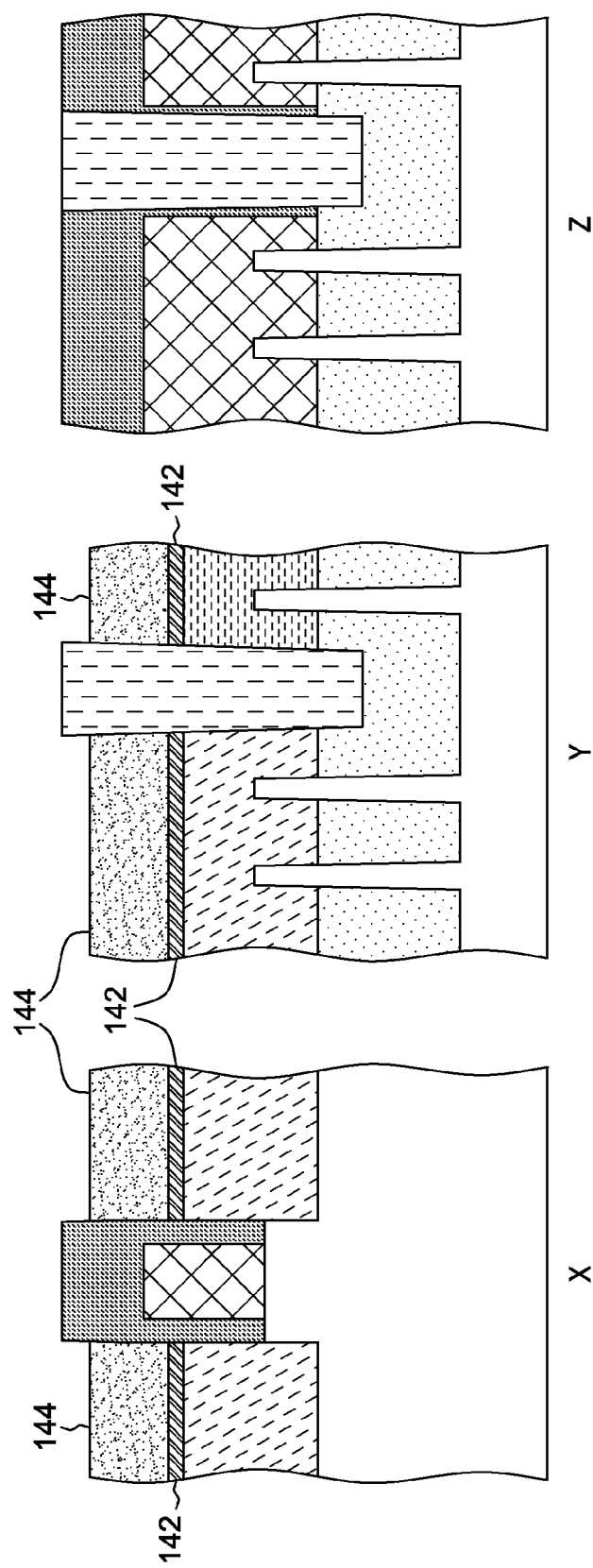
FIG. 11 depicts one example of the structure of FIG. 10 after removing the second dielectric layer, in accordance with one or more aspects of the present invention.

FIG. 11 depicts one example of the structure of FIG. 10 after removing what remains of the second dielectric layer (146, FIG. 10), in accordance with one or more aspects of the present invention. Removal of the second dielectric layer where oxide is used may be accomplished using, for example, an oxide deglazing process.

Figure 12:
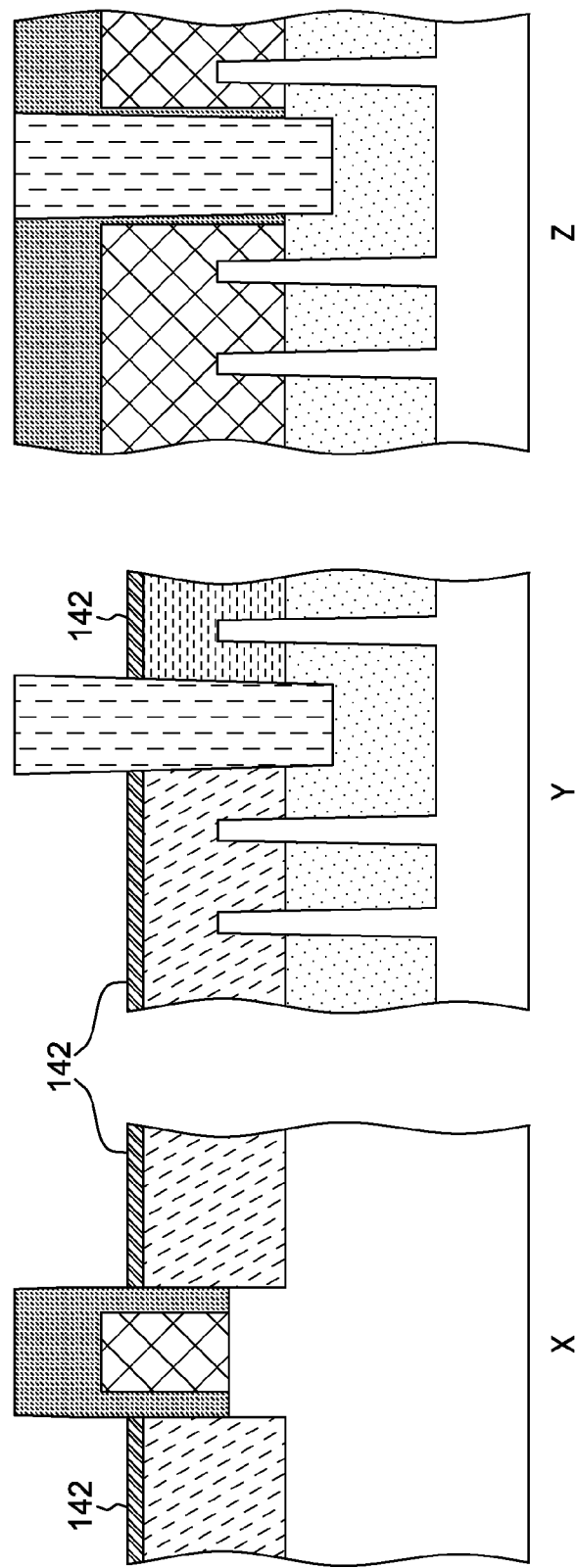
FIG. 12 depicts one example of the structure of FIG. 11 after removing a top layer of the sacrificial epitaxy, selective to the bottom layer therebelow, in accordance with one or more aspects of the present invention.

FIG. 12 depicts one example of the structure of FIG. 11 after removing the top layer (144, FIG. 11) of sacrificial epitaxy, selective to the bottom layer 142 therebelow, in accordance with one or more aspects of the present invention. In one example, the top layer includes epitaxial silicon and the bottom layer includes epitaxial silicon carbide, and removal of the top layer may be accomplished using, for example, a wet etch process.

Figure 13:
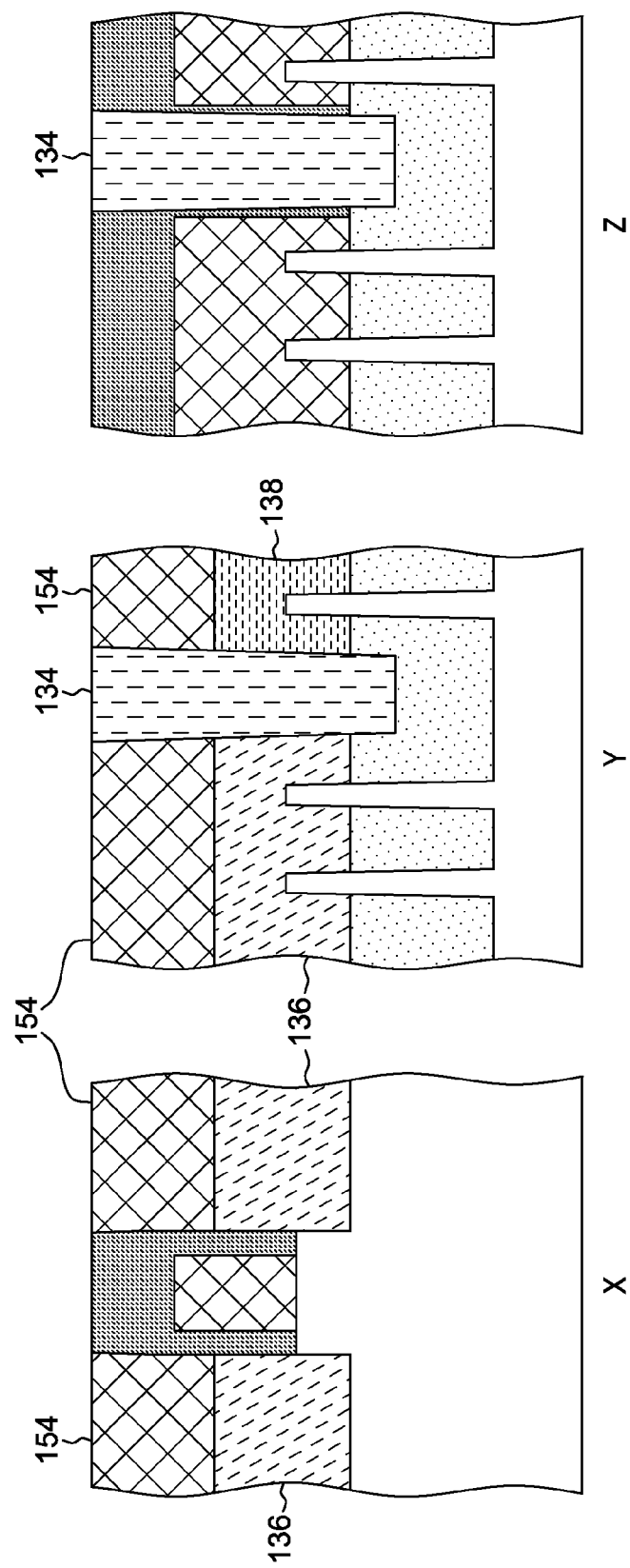
FIG. 13 depicts one example of the structure of FIG. 12 after removing the bottom layer of sacrificial epitaxy, selective to the different types of epitaxial material adjacent the barrier, and creation of a conductive layer above the different types of epitaxial material, in accordance with one or more aspects of the present invention.

FIG. 13 depicts one example of the structure of FIG. 12 after removing the bottom layer (142, FIG. 12) of sacrificial epitaxy, selective to the different types of epitaxial material (136 and 138) adjacent the barrier 134, and creation of a conductive layer 154 (e.g., a thin silicide layer at the bottom followed by conductive metal, such as cobalt or tungsten) above the different types of epitaxial material, in accordance with one or more aspects of the present invention.

Removal of the bottom layer of sacrificial epitaxy, selective to the different types of epitaxial material (136 and 138) below, may be accomplished using, for example, a wet etch process. Creation of conductive layer 154 may be accomplished using, for example, conventional processes and techniques.

Figure 14:
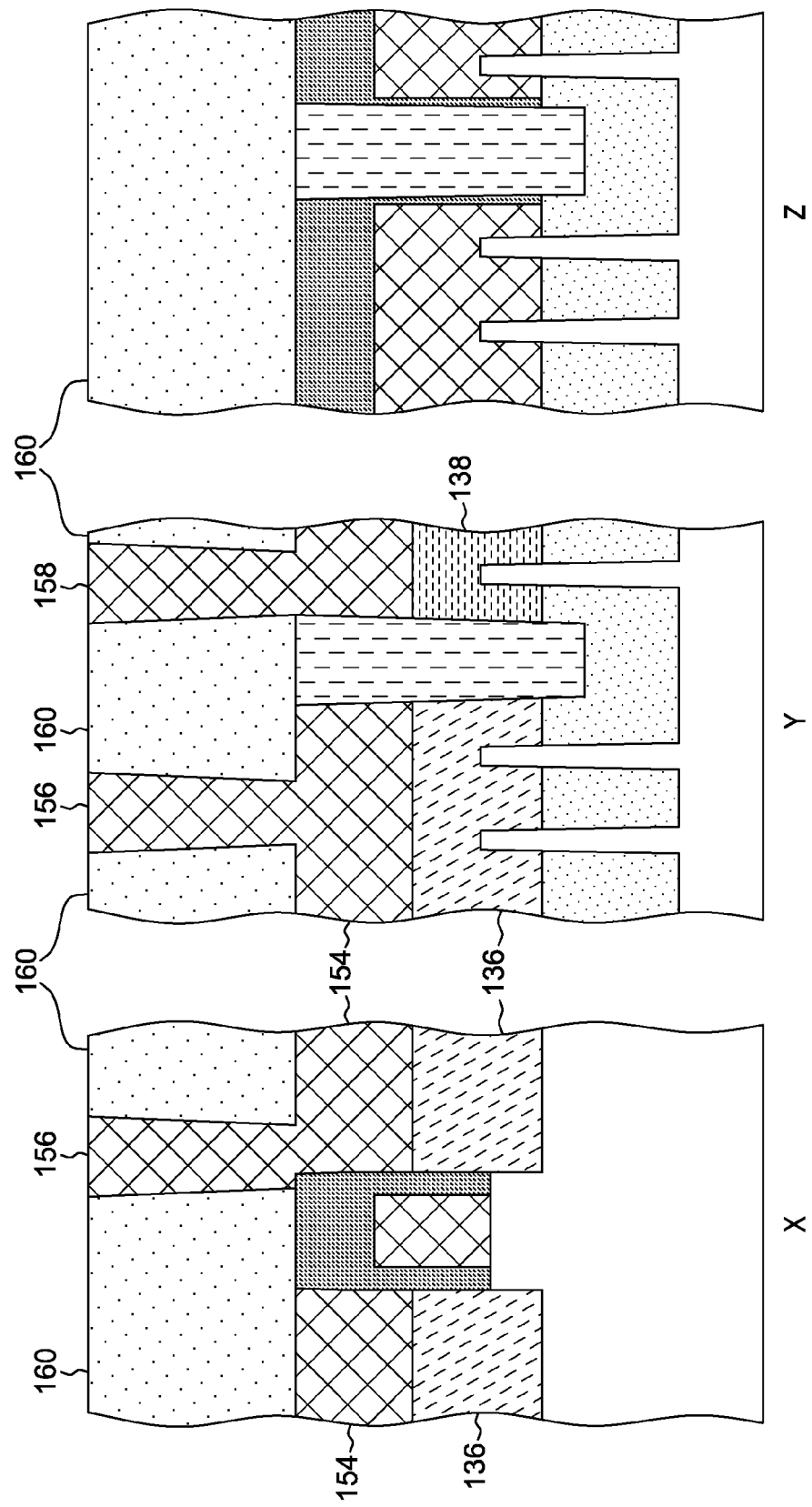
FIG. 14 depicts one example of the structure of FIG. 13 after creating contacts to the conductive layer, one contact for each of the different types of epitaxial material, in accordance with one or more aspects of the present invention.

FIG. 14 depicts one example of the structure of FIG. 13 after creating contacts 156 and 158 to the conductive layer 154 surrounded by a layer 160 of dielectric material, one contact for each of the different types of epitaxial material, in accordance with one or more aspects of the present invention.

Creation of contacts 156 and 158 may include first creating a layer 160 of dielectric material and making openings therein for the contacts, then filling the openings with conductive material (e.g., tungsten), all of which may be accomplished using, for example, conventional processes and techniques. Note that the relative thickness of conductive layer 154 allows for the contacts to be less wide than if conventionally fabricated.

In a first aspect, disclosed above is a method of contact formation. The method includes providing a starting semiconductor structure, the structure including a semiconductor substrate, multiple raised semiconductor structures coupled to the substrate, a bottom portion of the raised structures being surrounded by a first dielectric layer, dummy gate(s) covering a portion of each of the raised structures, spacers and a cap for each dummy gate. The method further includes creating epitaxy barrier(s) of hard mask material between adjacent raised structures, creating the different types of epitaxial material on the raised structures adjacent opposite sides of the epitaxy barrier(s), and creating sacrificial semiconductor epitaxy over the different types of epitaxial material, such that subsequent removal thereof can be done selective to the different types of epitaxial material.

In one example, creating the epitaxy barrier(s) may include, for example, patterning trench(es) for barrier material fill between different devices, and filling the trench(es) with hard mask material (one example of barrier material) different from that of the spacers and gate cap.

In one example, the trench(es) may be initially filled with, for example, dielectric material, and patterning the trench(es) may include, for example, creating a soft mask over a surface of the structure surrounding the trench(es), and removing the dielectric material selective to the material of the spacers and gate cap.

In one example, the trench(es) may be filled with, for example, a low-k nitride, e.g., polymer-derived amorphous silicon borocarbonitride (SiBCN).

In one example, creating the different types of epitaxial material in the method of the first aspect may include, for example, recessing the raised structures adjacent opposite sides of barrier(s) and creating the different types of epitaxial material in the recesses.

In one example, creating the sacrificial epitaxy in the method of the first aspect may include, for example, creating multiple different layers (e.g., two different layers) of sacrificial epitaxy. In one example, the sacrificial epitaxy may be, for example, silicon-based, and creating the different layers may include, for example, creating a layer of epitaxial silicon carbide over the different types of epitaxial material, and creating a layer of epitaxial silicon over the layer of epitaxial silicon carbide.

In one example, the method of the first aspect may further include removing the sacrificial epitaxy selective to the different types of epitaxial material.

In one example, the method of the first aspect may further include, for example, after creating the sacrificial epitaxy, replacing each dummy gate with a conductive gate, and, after replacing each dummy gate, replacing the sacrificial epitaxy with replacement conductive material.

In one example, where the conductive gate(s) and replacement conductive material are present, the method may further include, for example, creating contacts to the replacement conductive material.

In a second aspect, disclosed above is a semiconductor structure. The structure includes a semiconductor substrate and multiple raised semiconductor structures coupled to the substrate, a bottom portion of the raised structures being surrounded by a first dielectric layer. The structure further includes conductive gate(s) covering a portion of each of the raised structures, spacers and a cap for each conductive gate, epitaxy barrier(s) situated between adjacent raised structures extending into the first dielectric layer, and different types of epitaxial material adjacent opposite sides of each epitaxy barrier.

In one example, the starting structure of the second aspect may further include, for example, conductive material over the different types of epitaxial material to a top of the gate cap, and a contact to the conductive material for each of the different types of epitaxial material.

In a third aspect, disclosed above is an intermediate semiconductor structure. The structure includes a semiconductor substrate and multiple raised semiconductor structures coupled to the substrate, a bottom portion of the raised structures being surrounded by a first dielectric layer. The structure further includes dummy gate(s) covering a portion of each of the raised structures, spacers and a cap for each dummy gate, and epitaxy barrier(s) of hard mask material situated between adjacent raised structures and extending into the first dielectric layer.

In one example, the semiconductor structure of the third aspect may further include, for example, different types of epitaxial semiconductor material over the raised structures adjacent opposite sides of each epitaxy barrier.

In one example, where the different types of epitaxial material are present, the semiconductor structure may further include, for example, sacrificial semiconductor epitaxy over the different types of epitaxial material, the sacrificial semiconductor epitaxy being capable of removal selective to the different types of epitaxial semiconductor material.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting semiconductor structure, the structure comprising:
   a semiconductor substrate;
   a plurality of raised semiconductor structures coupled to the substrate, a bottom portion of the plurality of raised structures being surrounded by a first dielectric layer;
   at least one dummy gate covering a portion of each of the plurality of raised structures; and
   spacers and a cap for each dummy gate;
   creating at least one epitaxy barrier of hard mask material between adjacent raised structures;
   creating the different types of epitaxial material on the plurality of raised structures adjacent opposite sides of the at least one epitaxy barrier; and
   creating sacrificial semiconductor epitaxy over the different types of epitaxial material, such that subsequent removal thereof can be done selective to the different types of epitaxial material.

2. The method of claim 1, wherein creating the at least one epitaxy barrier comprises:
   patterning at least one trench for barrier material fill between different adjacent devices; and
   filling the at least one trench with a hard mask material different from that of the spacers and gate cap.

3. The method of claim 2, wherein the at least one trench is initially filled with dielectric material, and wherein patterning the at least one trench comprises:
creating a soft mask over a surface of the structure surrounding the at least one trench; and
removing the dielectric material selective to the material of the spacers and gate cap.

4. The method of claim 2, wherein the at least one trench is initially filled with a low-k nitride.

5. The method of claim 4, wherein the at least one trench is initially filled with polymer-derived amorphous silicon borocarbonitride (SiBCN).

6. The method of claim 1, wherein creating the different types of epitaxial material comprises:
recessing the plurality of raised structures adjacent opposite sides of the at least one epitaxy barrier; and
creating the different types of epitaxial material in the recesses.

7. The method of claim 1, wherein creating the sacrificial epitaxy comprises creating at least two different layers of sacrificial epitaxy.

8. The method of claim 7, wherein the sacrificial epitaxy is silicon-based, and wherein creating the at least two different layers comprises:
creating a layer of epitaxial silicon carbide over the different types of epitaxial material; and
creating a layer of epitaxial silicon over the layer of epitaxial silicon carbide.

9. The method of claim 1, further comprising removing the sacrificial epitaxy selective to the different types of epitaxial material.

10. The method of claim 1, further comprising, after creating the sacrificial epitaxy:
replacing each dummy gate with a conductive gate; and
after replacing each dummy gate, replacing the sacrificial epitaxy with replacement conductive material.

11. The method of claim 10, further comprising creating contacts to the replacement conductive material.

12. A semiconductor structure, comprising:
a semiconductor substrate;
a plurality of raised semiconductor structures coupled to the substrate, a bottom portion of the plurality of raised structures being surrounded by a first dielectric layer;
at least one conductive gate covering a portion of each of the plurality of raised structures;
spacers and a cap for each conductive gate;
at least one epitaxy barrier situated between adjacent raised structures extending into the first dielectric layer; and
different types of epitaxial material adjacent opposite sides of each epitaxy barrier.

13. The semiconductor structure of claim 12, further comprising:
conductive material over the different types of epitaxial material to a top of the gate cap; and
a contact to the conductive material for each of the different types of epitaxial material.

14. An intermediate semiconductor structure, comprising:
a semiconductor substrate;
a plurality of raised semiconductor structures coupled to the substrate, a bottom portion of the plurality of raised structures being surrounded by a first dielectric layer;
at least one dummy gate covering a portion of each of the plurality of raised structures;
spacers and a cap for each dummy gate; and
at least one epitaxy barrier of hard mask material situated between adjacent raised structures extending into the first dielectric layer.

15. The semiconductor structure of claim 14, further comprising different types of epitaxial semiconductor material over the at least two of the plurality of raised structures adjacent opposite sides of each epitaxy barrier.

16. The semiconductor structure of claim 15, further comprising sacrificial semiconductor epitaxy over the different types of epitaxial material, the sacrificial semiconductor epitaxy being capable of removal selective to the different types of epitaxial semiconductor material.

* * * * *